United States Patent
Fujishiro et al.

(10) Patent No.: US 7,197,056 B2
(45) Date of Patent: Mar. 27, 2007

(54) SEMICONDUCTOR LASER DEVICE AND OPTICAL DISC DRIVE

(75) Inventors: Yoshie Fujishiro, Tenri (JP); Ken Ohbayashi, Ikoma-gun (JP); Kei Yamamoto, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 83 days.

(21) Appl. No.: 10/494,946

(22) PCT Filed: Nov. 13, 2002

(86) PCT No.: PCT/JP02/11823

§ 371 (c)(1),
(2), (4) Date: May 7, 2004

(87) PCT Pub. No.: WO03/043151

PCT Pub. Date: May 22, 2003

(65) Prior Publication Data

US 2005/0041708 A1    Feb. 24, 2005

(30) Foreign Application Priority Data

Nov. 15, 2001 (JP) ............................. 2001-350030

(51) Int. Cl.
*H01S 5/34* (2006.01)
*H01S 5/00* (2006.01)

(52) U.S. Cl. ................................. 372/45.011
(58) Field of Classification Search ............ 372/45.011
See application file for complete search history.

(56) References Cited

U.S. PATENT DOCUMENTS 5,671,242 A    9/1997    Takiguchi et al.
5,832,018 A *  11/1998   Ohkubo ................. 372/45.011

(Continued)

FOREIGN PATENT DOCUMENTS

EP    0 920 096 A2    6/1999

(Continued)

OTHER PUBLICATIONS

A. Al-Muhanna et al. 780nm-emitting Al-free active region diode lasers with compressively-strained InGaAsP quantum wells. LEOS '97 10th Meeting, Conference Proceedings, IEEE, Nov. 10, 1997, vol. 3, pp. 201 to 202.*

(Continued)

*Primary Examiner*—Minsun Oh Harvey
*Assistant Examiner*—Rory Finneren
(74) *Attorney, Agent, or Firm*—Nixon & Vanderhye P.C.

(57) ABSTRACT

A 780 nm band semiconductor laser device has an InGaAsP well layer, phosphorous composition of which is 0.51 smaller than 0.55 to prevent spinodal decomposition in growing InGaAsP. A compressive strain of 0.65% less than 1% and more than 0.25% is introduced into the well layer to reduce threshold current thereof. Thus, the 0.78-μm band semiconductor laser device having the InGaAsP well layer stably operates for a long time even in outputting a high optical power of 100 mW or more. A tensile strain of 1.2% is also introduced into barrier layers within the active region so as to compensate the stress due to the compressive strain of the well layer. As a result, the reliability of the semiconductor laser device is further increased during a high output operation.

7 Claims, 10 Drawing Sheets

U.S. PATENT DOCUMENTS

| | | |
|---|---|---|
| 5,929,462 A | 7/1999 | Kasukawa et al. |
| 2001/0017875 A1 | 8/2001 | Fukunaga et al. |

FOREIGN PATENT DOCUMENTS

| | | | |
|---|---|---|---|
| JP | 7-122811 | | 5/1995 |
| JP | 7-202310 | | 8/1995 |
| JP | 8-316588 | | 11/1996 |
| JP | 9-162482 | | 6/1997 |
| JP | 9-162482 A | * | 6/1997 |
| JP | 10-107369 | | 4/1998 |
| JP | 10-107369 A | * | 4/1998 |
| JP | 2001-168458 | | 6/2001 |
| JP | 2001168458 A | * | 6/2001 |

OTHER PUBLICATIONS

Mawst, L.J., Short-Wavelength High-Power InGaAsP-Active Diode Lasers. IEEE Journal of Selected Topics in Quantum Electronics, vol. 5, No. 3, May/Jun. 1999, pp. 785 to 791.*

Al-Muhanna, A. et al., 780 nm emitting Al-free active region diode lasers with compressively-strained InGaAsP quantum wells,. LEOS '97 10th Meeting, Conference Proceedings., IEEE, Nov. 10, 1997, vol. 2, pp. 201 to 202.

Mawst, L.J., Short-Wavelength High-Power InGaAsP-Active Diode Lasers. IEEE Journal of Selected Topics in Quantum Electronics, vol. 5, No. 3, May/Jun. 1999, pp. 785 to 791.

Supplementary European Search Report dated Nov. 24, 2004.

JP 8-78786 (U.S. counterpart is US 5,671,242) listed above.

"Bandgap and Lattice Constant of GaInAsP as a Function of Alloy Composition" Moon et al., Journal of Electronic Materials, vol. 3, No. 3, 1974, pp. 635-644.

* cited by examiner

SEMICONDUCTOR LASER DEVICE AND OPTICAL DISC DRIVE

This application is the US national phase of international application PCT/JP02/11823 filed in Japanese on 13 Nov. 2002, which designated the US. PCT/JP02/11823 claims priority to JP Application No. 2001-350030 filed 15 Nov. 2001. The entire contents of these applications are incorporated herein by reference.

TECHNICAL FIELD

This invention relates to a semiconductor laser device used for an optical disc unit in the field of CD (compact disc), MD (mini disc) or the like, wherein a particularly high optical power has recently been required, and relates to an optical disc unit using the semiconductor laser device.

BACKGROUND ART

AlGaAs semiconductor laser devices are abundantly used for various purposes such as light-emitting devices for pickup in the field of optical discs including CD, MD or the like. In general, the semiconductor laser devices have a structure formed by sequentially stacking, for example, an n-type AlGaAs cladding layer, an AlGaAs active layer, a p-type AlGaAs cladding layer and a p-type GaAs contact layer in this order on an n-type GaAs substrate. However, this structure of the semiconductor laser devices has a serious problem regarding reliability such as Catastrophic Optical Damage (COD) or the short lifetime of the device because the active layer contains aluminum (Al). The reason therefor is that a large number of non-radiative recombination levels are formed in cleavage-formed end faces of a resonator including Al because Al is an easily oxidized substance characteristically. For this reason, there have been attempts for making free from Al the active layer and its peripheral layers in the AlGaAs semiconductor laser devices.

For example, JP 11-220224 A discloses such an aluminum-free semiconductor laser device as sated above. FIG. 9 shows a structure of this semiconductor laser device. On an GaAs substrate 1, there are sequentially stacked a p-type AlGaAs lower cladding layer 2, an i-type InGaAsP lower light-guiding layer 3, a multiquantum well active region 4 composed of one InGaAsP well layer with no stain or a tensile strain of not more than 0.3% (i.e. $-0.3\% \leq$ strain$<0\%$) and two InGaAsP barrier layers having a tensile strain which are alternately stacked, an i-type InGaAsP upper light-guiding layer 5, an n-type AlGaAs upper first cladding layer 6, an n-type InGaP etching stopper layer 7, an n-type AlGaAs upper second cladding layer 8 and an n-type GaAs contact layer 9. A ridge stripe structure formed of the upper second cladding layer 8 and the contact layer 9 is formed immediately above the etching stopper layer 7.

The ridge stripe structure has a height of 2.2 μm and a width of about 3 μm at the widest portion immediately above the etching stopper layer 7. An $SiO_2$ film is stacked on both lateral sides of the ridge stripe structure as an insulating film 10 to form a current constriction structure wherein a current flows only mainly immediately below the ridge stripe structure. In the semiconductor laser device with the above constitution, materials containing no Al are used in the active region in order to prevent degradation of cleaved end faces due to oxidation of Al, whereby the COD level is improved.

In this conventional semiconductor laser device, no strain or a tensile strain is applied as the strain of the well layer. The reason thereof is as follows.

In InGaAsP of a quaternary compound, there are differences in size and binding energy of constituent atoms. Therefore, there are its compositions and temperatures where phase separation makes the quaternary compound more stable from viewpoint of free energy. This phenomenon of phase separation is referred to as spinodal decomposition. Further, a region causing the phase separation is referred to as a miscibility gap.

FIG. 10 shows spinodal curves where are shown temperatures at which spinodal decomposition of InGaAsP generates. The curves are described in such a literature as Jap. J. Appl. Phys., 21, p797 (1982) etc. and are generally well known. The spinodal decomposition occurs when growing the InGaAsP having a certain composition at a temperature lower than that shown in FIG. 10. Thus, it is required that InGaAsP having a composition on a curve of for example 600° C. should be grown at 600° C. or more. When growing InGaAsP having a composition inside the curve of 600° C., the InGaAsP should be grown at a further higher temperature.

However, when growing the InGaAsP by using the metal organic chemical vapor deposition (MOCVD) method and the like, the growth temperature thereof is about 600° C. to 670° C. in general. This derives from the fact that the growth temperature cannot be raised since an element of phosphorous has a high vapor pressure and is thus easily detached. Therefore, spinodal decomposition generates when growing InGaAsP having a composition inside the spinodal curve of 600° C. to 670° C., so that good InGaAsP crystals are not grown. For this reason, in order to surely obtain good crystals of InGaAsP by growing it in the growth temperature range of 600° C. to 670° C., a composition of InGaAsP existing outside a limitary spinodal curve around 500° C. to 600° C. should be used.

FIG. 10 also shows well known energy bandgap (Eg) lines of InGaAsP etc. that are described in Journal of Electronic Materials, Vol. 3, No. 3, p. 635 (1974). Furthermore, strain amounts (1.0%, 0.25%, 0%, −1.0%) with respect to GaAs are shown in broken lines. It should be noted that the strain is referred to as a "compressive strain" when the strain amount has a positive value, and the strain is referred to as a "tensile strain" when the strain amount has a negative value. The magnitude of the compressive/tensile strain is expressed by an absolute value of the strain amount.

In this case that a semiconductor laser device having an InGaAsP well layer is oscillated at a wavelength of for example 780 nm, Eg required for the InGaAsP well layer is in the vicinity of 1.55 eV to 1.60 eV indicated by a region (a) of FIG. 10. Therefore, intersection between the region (a) and the temperature range of 500° C. to 600° C., which temperature range corresponds to the boundary spinodal curve wherein good InGaAsP crystals are surely obtained, preferably exists just in the vicinity of no strain i.e. the strain amount 0% with respect to GaAs. From the above, in order to obtain good InGaAsP crystals, it is required that the InGaAsP should have a composition existing within the region (a) and toward a right-lower direction than the boundary of the spinodal curve of 500° C. to 600° C. in FIG. 10, namely a composition within the region with no strain or a slight tensile strain. In particular, the spinodal curve designates at least 650° C. within the region (a), at which temperature spinodal decomposition occurs, in a composition having a compressive strain of 0.25% or more wherein the strain effect greatly appears. Thus, it is difficult to surely obtain good InGaAsP crystals under this condition.

In the case where a strain is introduced to a semiconductor laser device, a reduction in the threshold current is expected as the general effect of the strain. The reduction in the threshold current caused by strain varies according to the amount of strain in both compressive and tensile strains. For example, relationship between a strain amount and a threshold current density is described in a literature "P.J.A. Thijs, Proc. 13th IEEE Int. Semiconductor Laser Conf., Takamatsu Japan, p2 (September 1992)" which is related to an InGaAs well layer for oscillating at a long wavelength for communication. FIG. 11 shows relationship between the strain amount and the threshold current density described in this literature. According to this figure, the threshold current density is most lowered around 1.5% in both cases of the compressive strain and the tensile strain. In the case of the tensile strain between 0% exclusive and 1% inclusive, the threshold current density becomes higher compared with the case of no strain. To obtain a lower threshold current density, therefore, it is required that the tensile strain exceed 1%.

However, as mentioned above, the tensile strain of 1% cannot be obtained within the range of the region (a) of the Eg required for the InGaAsP well layer(s) in the case of the semiconductor laser device having the InGaAsP well layer(s) that oscillates laser light at the conventional wavelength of 780 nm. That is, there is a problem that a low threshold current cannot be obtained in the case where a semiconductor laser device having a well layer(s) with a tensile strain is oscillated at a wavelength of 780 nm.

DISCLOSURE OF INVENTION

An object of the invention is to provide a 780 nm band semiconductor laser device having an InGaAsP well layer(s) which can achieve a low threshold current, and an optical disc unit using the semiconductor laser device.

In order to achieve the above object, a first invention provides a semiconductor laser device having an oscillation wavelength of more than 0.76 μm and less than 0.8 μm, the semiconductor laser device comprising:
a first conductive-type cladding layer;
a first guide layer;
a strained quantum well active region including a well layer to which a compressive strain is introduced;
a second guide layer; and
a second conductive-type cladding layer, at least which are sequentially stacked on a GaAs substrate, wherein the well layer is formed of $InGaAs_{1-x}P_x$, and wherein x<0.55, and $$\{a(\text{well})-a(\text{GaAs})\}/a(\text{GaAs})\times 100 < 1.0 (\%)$$

where a(well) is defined as a lattice constant of a constituent material of the well layer, and where a(GaAs) is defined as a lattice constant of the GaAs substrate.

According to the above constitution, the strain of the $InGaAs_{1-x}P_x$ well layer with respect to the GaAs substrate becomes a compressive strain of less than 1%, and the P composition in Group V elements becomes smaller than 0.55. Thus, the temperature of the spinodal decomposition is sufficiently decreased to an extent for growing InGaAsP, so that a highly reliable semiconductor laser device is obtained. Further, the well layer is made aluminum-free whereby degradation of the strained quantum well active region is prevented. Furthermore, since the strain of the well layer is a compressive strain of less than 1%, it becomes possible to more decrease the threshold current density compared with the case of no strain.

That is, a 780 nm band semiconductor laser device having a low threshold current density can be obtained which stably operates for a long time even in a high power.

In one embodiment of the semiconductor laser device of the first invention, a value of $[\{a(\text{well})-a(\text{GaAs})\}/a(\text{GaAs})]\times 100$ representing a strain amount of the well layer is more than 0.25%.

According to the embodiment, decrease of threshold current is more reliably obtained since the compressive strain amount of the well layer is more than 0.25%. Thus, the driving current is more surely reduced by the compressive strain, and as the result, its reliability is enhanced.

In one embodiment of the first invention, a value of x that represents a P composition in Group V elements of the well layer is smaller than 0.50.

According to the embodiment, occurrence of spinodal decomposition during the growth of InGaAsP is further suppressed since the P composition of the well layer is smaller than 0.50. Thereby, a semiconductor laser device having high reliability is obtained.

In one embodiment of the semiconductor laser device of the first invention, the well layer has a compressive strain amount of less than 0.5%.

According to the embodiment, occurrence of spinodal decomposition during the growth of InGaAsP is further suppressed since the compressive strain amount of the well layer is less than 0.5%. Thus, a semiconductor laser device having high reliability in particular is obtained.

In one embodiment of the semiconductor laser device of the first invention, the strained quantum well active region includes a barrier layer into which a tensile strain is introduced.

According to the embodiment, since the tensile strain is introduced into the barrier layer constituting the strained quantum well active region, the strain compensation is made in all of the strained quantum well active region. Therefore, a stress derived from the compressive strain is relaxed, preventing degradation of crystals in the well layer. As a result, its reliability is more stabilized in a high power operation.

In one embodiment of the semiconductor laser device of the first invention, the well layer has a layer thickness larger than 8 nm.

According to the embodiment, since the well layer has a layer thickness larger than 8 nm, the average strain amount within the active region becomes smaller. This tendency is true even if the compressive strain amount of the well layer and the tensile strain amount of the barrier layer are set in such a manner as to have a big difference in absolute value therebetween for the purpose of enlarging energy band difference. Accordingly, it becomes possible to simultaneously achieve both the low threshold current and high reliability. Furthermore, even if dullness occurs in steepness of the interface between the well layer and the barrier layer, the effect of the dullness in the energy band structure is relatively reduced. Thus, deterioration of the characteristics of the element due to the dullness of the energy band structure is prevented.

A second invention provides an optical disc unit wherein the above-stated semiconductor laser device is used as a light-emitting device.

According to the above constitution, a light-emitting device outputting a higher optical power than ever before is used for an optical disc unit of CD or MD. Therefore, read-and-write operations are implementable even if the optical disk is rotated at a higher speed than conventional one. Particularly, the access time to optical disks is remarkably reduced, which time has been a subject to be solved at the time of writing data onto CD-R (CD recordable), CD-RW (CD rewritable) or the like.

BEST MODE FOR CARRYING OUT THE INVENTION

The invention will hereinafter be described in detail by embodiments with reference to drawings.

First Embodiment

Figure 1:
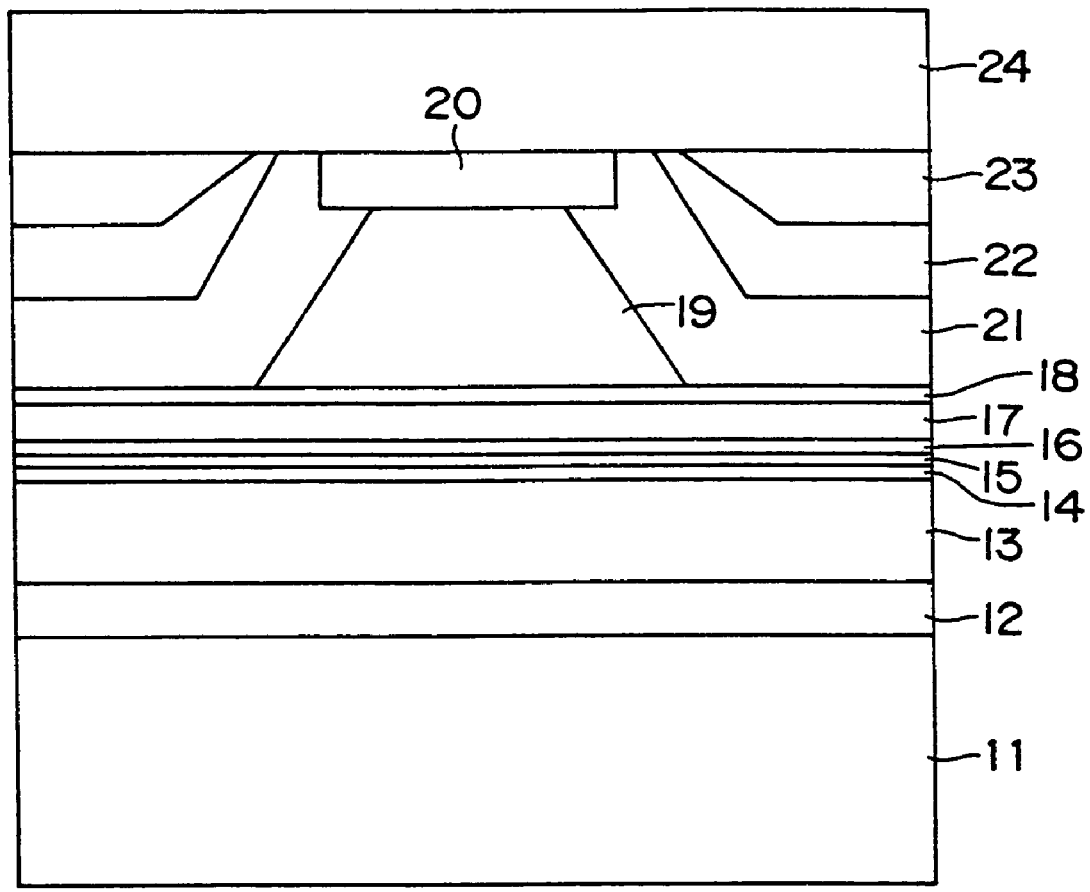
FIG. 1 is a cross sectional view showing the constitution in a semiconductor laser device of the present invention.

FIG. 1 is a cross sectional view showing a constitution in a semiconductor laser device of the present embodiment. FIG. 2 is a schematic cross sectional view showing a process for producing the semiconductor laser device shown in FIG. 1. The present embodiment relates to a semiconductor laser device whose oscillation wavelength belongs to a 0.78-μm band, the semiconductor laser device having a quantum well active region made of InGaAsP well layers and having a compressive strain of larger than 0.25 and smaller than 1.0%.

As shown in FIG. 1, in the semiconductor laser device of the present embodiment, the following layers are sequentially formed on an n-type GaAs substrate 11: an n-type GaAs buffer layer (layer thickness of 0.5 μm) 12, an n-type $Al_{0.5}Ga_{0.5}As$ lower cladding layer (layer thickness of 1.7 μm) 13, a lower light-guiding layer 14 consisting of two layers of an i-type $Al_{0.3}Ga_{0.7}As$ (layer thickness of 40 nm) and an i-type $Al_{0.2}Ga_{0.8}As$ (layer thickness of 5 nm) sequentially formed in this order, a multiquantum well active layer (oscillation wavelength of 0.785 μm) 15, an upper light-guiding layer 16 consisting of two layers of an i-type $Al_{0.2}Ga_{0.8}As$ (layer thickness of 5 nm) and an i-type $Al_{0.3}Ga_{0.7}As$ (layer thickness of 40 nm) sequentially formed in this order, a p-type $Al_{0.5}Ga_{0.5}As$ upper first cladding layer (layer thickness of 0.2 μm) 17, a p-type GaAs etching stopper layer (layer thickness of 3 nm) 18, a p-type $Al_{0.5}Ga_{0.5}As$ upper second cladding layer (layer thickness of 1.2 μm) 19, and a p-type GaAs contact layer (layer thickness of 0.7 μm) 20. These layers are stacked on GaAs substrate 11 in above-stated order. A ridge stripe structure comprising of the AlGaAs upper second cladding layer 19 and the GaAs contact layer 20 is formed immediately above the GaAs etching stopper layer 18. The ridge stripe structure has a height of about 2 μm and a width of about 2.5 μm at the widest portion immediately above the etching stopper layer 18.

Further, an n-type $Al_{0.7}Ga_{0.3}As$ first buried layer (layer thickness of 0.6 μm) 21, an n-type GaAs second buried layer (layer thickness of 0.6 μm) 22 and a p-type GaAs third buried layer (layer thickness of 0.7 μm) 23 are sequentially formed on both sides of the ridge stripe structure in a manner so as to fill gaps on lateral sides thereof. Thus, a current constriction structure is formed where a current flows only mainly immediately below the ridge stripe structure. Further, a p-type GaAs cap layer (layer thickness of 2 μm) 24 is stacked above the entire upper surfaces of the ridge stripe structure and the first to third buried layers 21 to 23.

The multiquantum well active region 15 is formed by alternately stacking two $In_{0.34}Ga_{0.66}As_{0.49}P_{0.51}$ well layers having (layer thickness of 7.5 nm) a compressive strain of 0.65% and three $In_{0.05}Ga_{0.95}As_{0.56}P_{0.44}$ barrier layers having a tensile strain of 1.2%. That is, the well layers each are interposed between the barrier layers. Viewing from the side of the substrate, a first and a third layers of the three barrier layers have a thickness of 7.5 nm, and a second layer has a thickness of 7 nm.

Figure 2A:
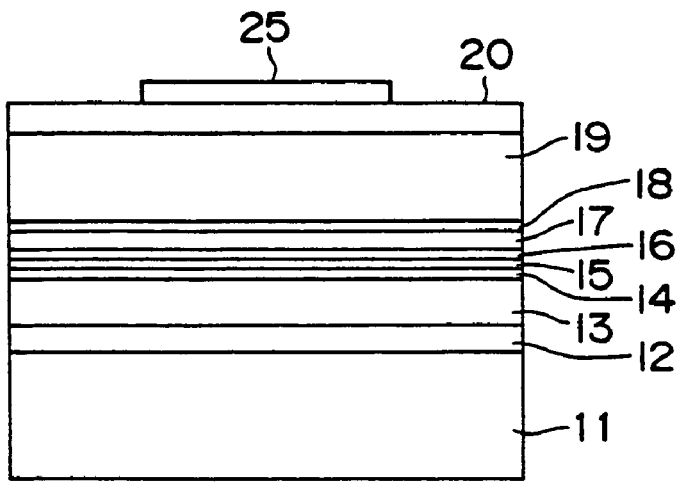
FIGS. 2A, 2B, 2C are views showing a process for producing the semiconductor laser device shown in FIG. 1.

The semiconductor laser device having the above constitution including InGaAsP well layers with the compressive strain of 0.65% is fabricated as follows. Incidentally, constituent material and thickness for each layer are omitted in the following description. First, as shown in FIG. 2A, the following layers are stacked on an n-type substrate 11 in order by using the MOCVD: an n-type buffer layer 12, an n-type lower cladding layer 13, a lower light-guiding layer 14, a multiquantum well active region 15 composed of three barrier layers and two well layers alternately disposed, an upper light-guiding layer 16, a p-type upper first cladding layer 17, a p-type etching stopper layer 18, a p-type upper second cladding layer 19 and a p-type contact layer 20. When growing layers around the multiquantum well active region 15, the atmospheric temperature is 670° C. Further, a stripe-shaped resist mask 25 is formed on a portion of the p-type contact layer 20 where a ridge stripe shape is formed.

Figure 2B:
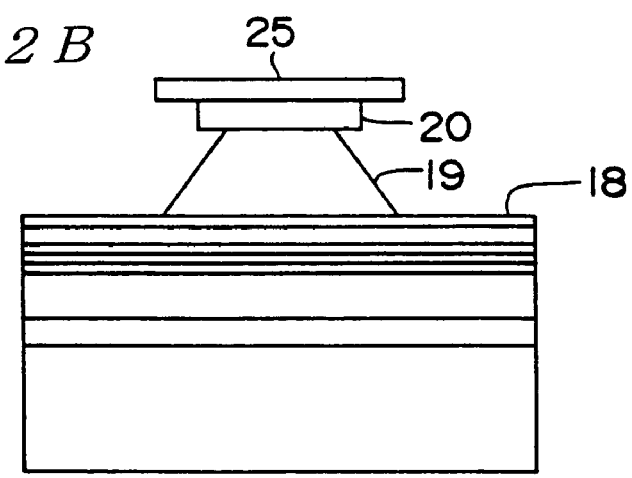

Next, as shown in FIG. 2B, only portions of the p-type contact layer 20 and the p-type upper second cladding layer 19 other than the portion immediately below the resist mask 25 are removed by a wet etching method, so that a ridge stripe structure is formed which has a height of about 2 μm and a width of about 2.5 μm at the widest portion. Etching in this case is performed up to an upper surface of the p-type etching stopper layer 18 in two steps by using a mixed aqueous solution of sulfuric acid and hydrogen peroxide water, and hydrofluoric acid.

Figure 2C:
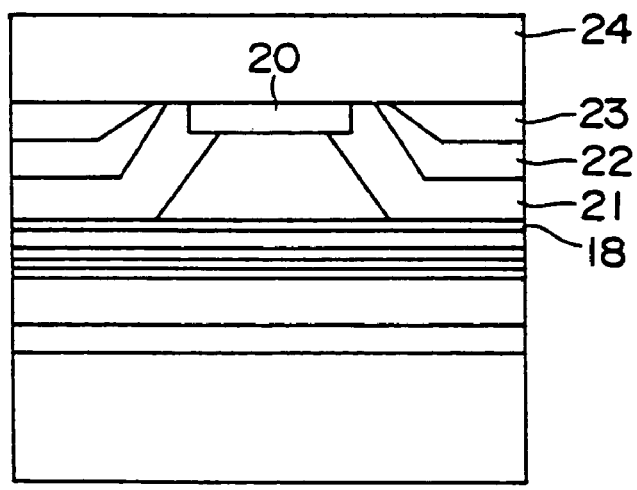

Next, as shown in FIG. 2C, an n-type first buried layer 21, an n-type second buried layer 22 and a p-type third buried layer 23 are sequentially stacked on both sides of the ridge stripe structure again by the MOCVD method in a manner so as to fill gaps on lateral sides of the ridge stripe structure. In this case, on an upper surface of the ridge stripe structure, the respective buried layers 21, 22, 23 are formed into a convex shape which reflects the shape of the ridge stripe structure. Next, a resist mask (not shown) is formed in a manner so as to cover a region other than the convex portion of the p-type third buried layer 23. Then, only the first to third buried layers 21 to 23 on the convex portion are sequentially removed by etching to expose an upper surface of the p-type contact layer 20. Thereafter, the resist mask is removed and then a p-type cap layer 24 is stacked on the entire surface by the MOCVD method again.

Subsequently, although not shown, an n-type side electrode is formed on a surface of the substrate 11, while a p-type side electrode is formed on a surface of the p-type cap layer 24. After that, a conventional wafer process is undergone to form a buried ridge-type semiconductor laser device having a resonator length of 800 μm.

Figure 10:
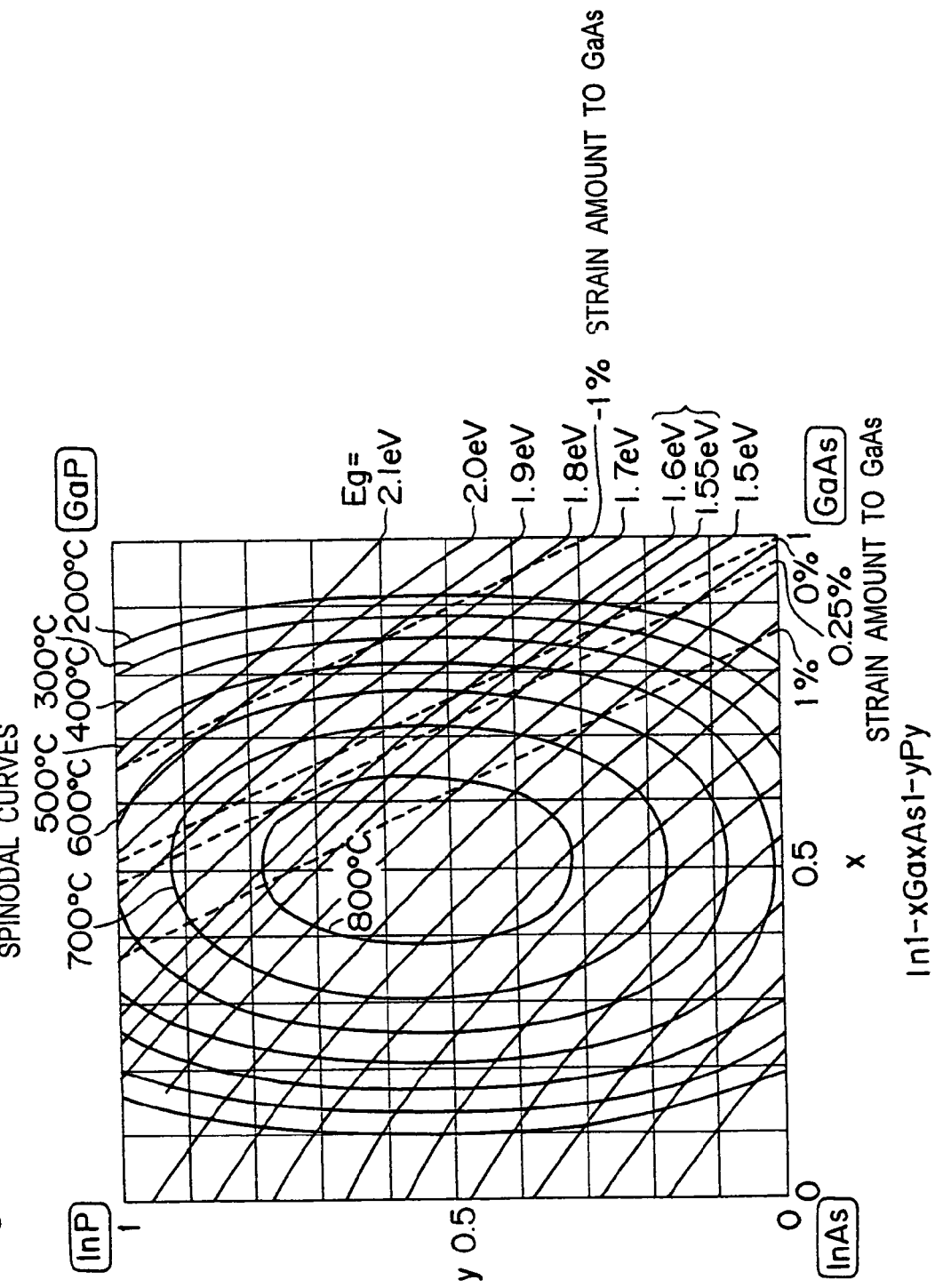
FIG. 10 is a view showing spinodal curves of InGaAsP that have conventionally been used.

When applying InGaAsP to a strained quantum well layer of a 0.78-μm band semiconductor laser device, it is improper to directly apply the spinodal curves shown in FIG. 10 thereto. The main reasons for that are the following three points:

1) In the case of compressive strain, Eg become larger in comparison with the case of no strain as the amount of strain becomes larger. As for this phenomena, a literature "J. Appl. Phys., 54, 4, p2052 (1983)" discloses actually measured data about InGaP instead of InGaAsP. Judging from changes of Eg, it is presumed that the lines representing respective Eg values in FIG. 10 incline, with the inclination of each Eg line changing at a point of intersection between each Eg line and the broken line representing the strain of 0% with respect to GaAs, such that the Eg lines get closer to the horizon as the lines get away from the strain line of 0% to the compressive stain side. Therefore, a region of the compressive strain side within the region (a) shown in FIG. 10, where the oscillation occurs at a wavelength of 780 nm is obtained, deviates toward a less composition of phosphorus (P).

2) The Eg data of InGaAsP shown in FIG. 10 were issued more than 20 years ago, and it is uncertain to what extent the data values are accurate. Thereafter, formulas about Eg with respect to the composition have been issued in some literatures. However, each of formulas is different, and the accuracy of data remains still uncertain.

3) The spinodal curves of FIG. 10 are obtained by calculation based on binding energy between atoms. In the case of a thin layer such as the well layer, the curves may change due to influence of lattice matching with an underlayer. That is to say, in the case of a layer having a small thickness and a small strain amount, it will match with lattice arrangement of the GaAs substrate nevertheless a strain is included. Thus, the crystal takes a stable state of free energy by having a lattice constant close to lattice matching although the crystal originally has unstable free energy and a limited spinodal decomposition temperature. It is considered that it is possible for the crystal to grow at a lower temperature since the temperature of the spinodal decomposition decreases. It is also considered that the spinodal decomposition temperature may change by crystal growing methods and the like.

These data in the prior arts are insufficient in quantity. However, setting a P composition smaller makes it possible to grow a compressive strain that oscillates in the 780 nm band, which has been considered as impossible in the conventional techniques.

Thus, semiconductor laser devices including InGaAsP well layers have been made by variously changing compositions in a region having a compressive strain within the region (a) shown in FIG. 10, where the P composition is smaller, so as to examine and compare their characteristics. As a result, a semiconductor laser device having a high power and high reliability is obtained by setting the amount of compressive strain to less than 1% and reducing the P composition to smaller than 0.55, just like the $In_{0.34}Ga_{0.66}As_{0.49}P_{0.51}$ well layer having a compressive strain of 0.65% of the present embodiment.

Figure 3:
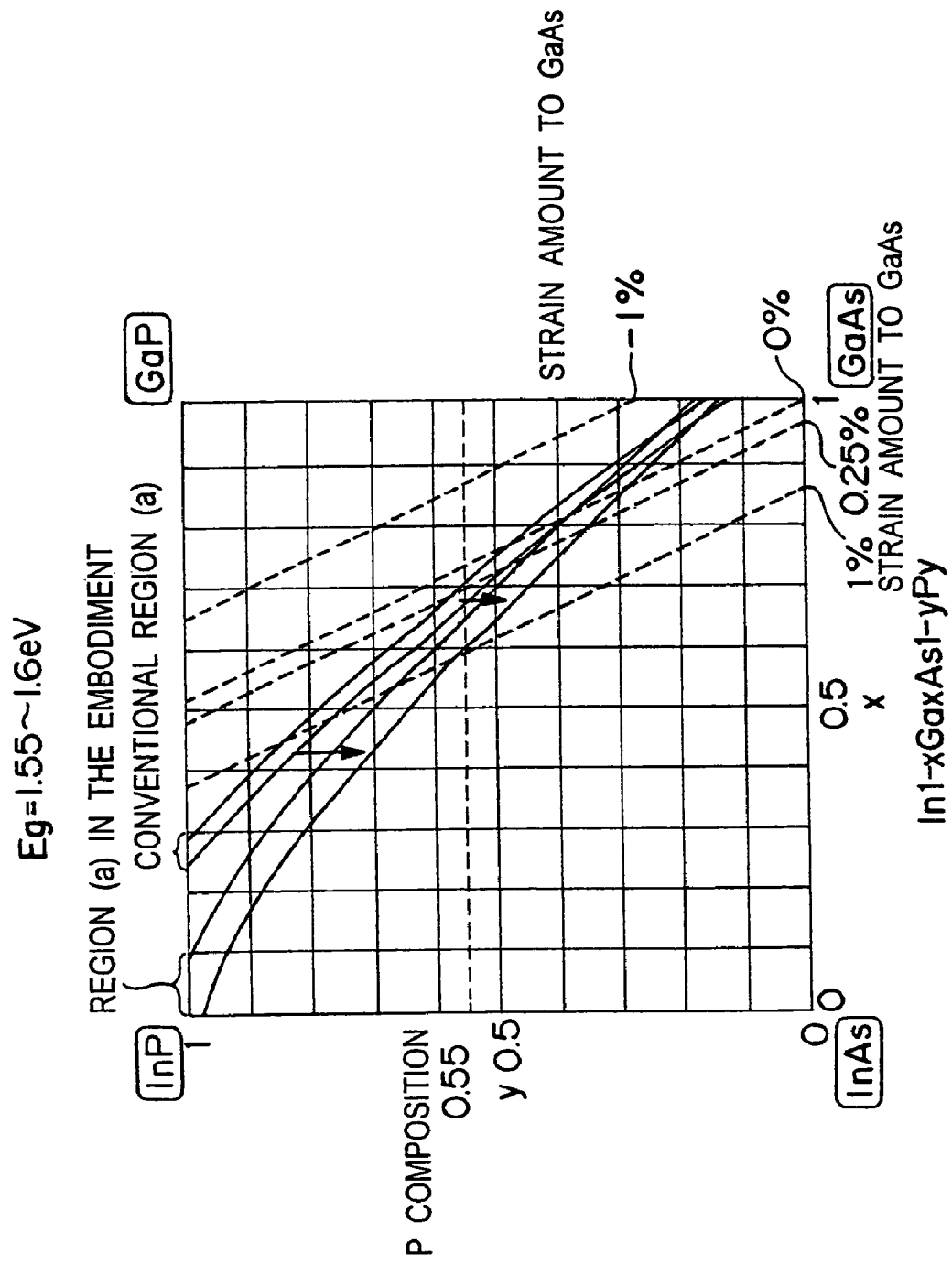
FIG. 3 is a view showing a presumed Eg region (a) in which laser oscillates at a wavelength of 780 nm.

This result implies on the basis of the above-stated 3) that the temperature at which spinodal decomposition occurs is sufficiently lowered by reducing the amount of compressive strain to less than 1%, so that InGaAsP grows. The result also implies on the basis of 1) and 2) that Eg obtaining the wavelength of 780 nm deviates from the Eg line shown in FIG. 10 toward the region of a smaller P composition. FIG. 3 shows Eg lines of 1.55 eV and 1.60 eV between which a region (a) is formed and which lines derive from 1) and 2). Although those lines do not necessarily show strictly correct values, based on the region (a) shown in FIG. 3, semiconductor laser devices are actually made in the present embodiment. Thereby, the effective P composition smaller than 0.55 is obtained. FIG. 3 also shows Eg lines forming a conventional region (a) for comparison.

Further, reduction of the compressive strain amount to less than 0.5% or reduction of the P composition to less than 0.50 suppresses the spinodal decomposition, so that reliability of the semiconductor laser device becomes higher.

Figure 4:
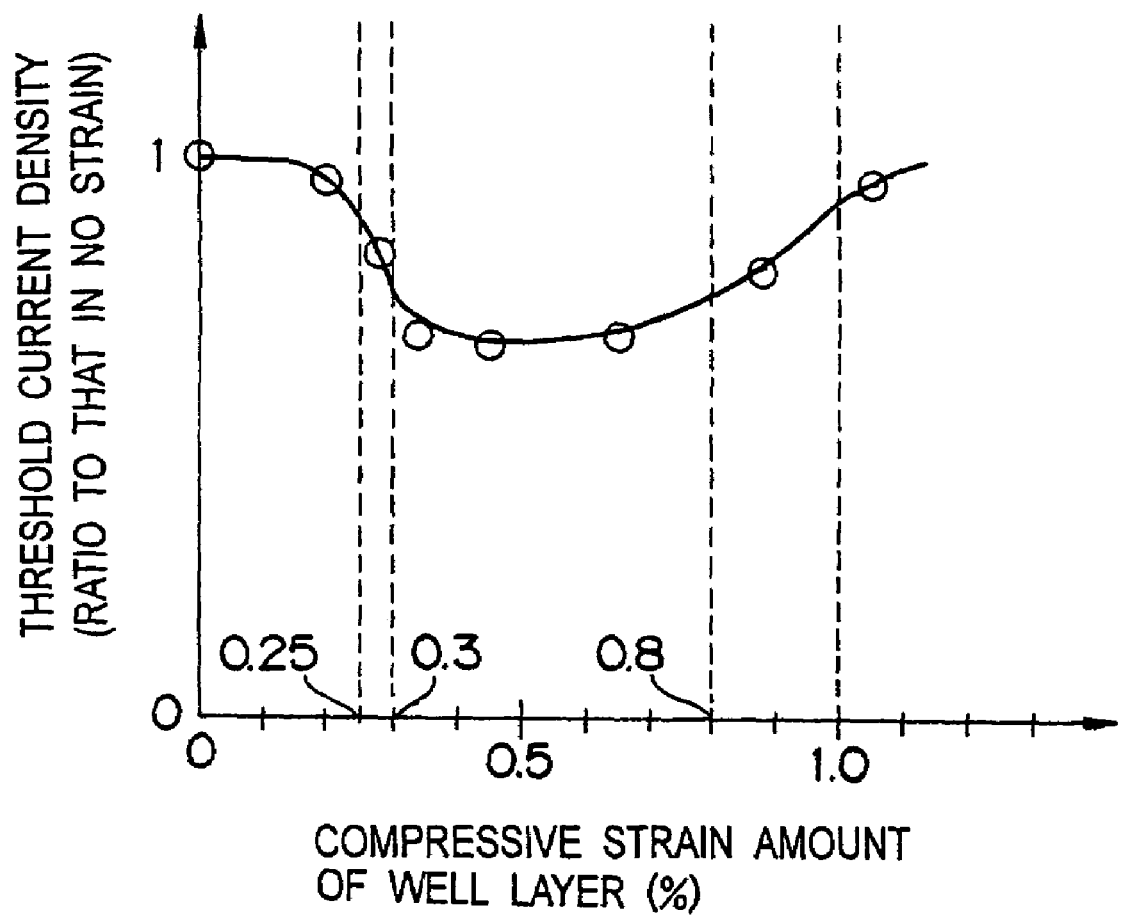
FIG. 4 is a view that shows a change in threshold current density with respect to a compressive strain amount of a well layer.

Relationship between the threshold current density and the compressive strain amount of the well layer is studied in a semiconductor laser device including the compressively strained InGaAsP quantum well layer with the above-stated constitution. As shown in FIG. 4, the threshold current density is markedly reduced in the range of 0.25%<compressive strain amount<1.0% regarding the strain amount of the well layer, compared with the case of no strain. When the compressive strain amount is particularly in the range of 0.3%<compressive strain amount<0.8%, reduction of the threshold current density is more markedly reduced to represent improvement in the threshold current density by introduction of compressive strain.

Figure 11:
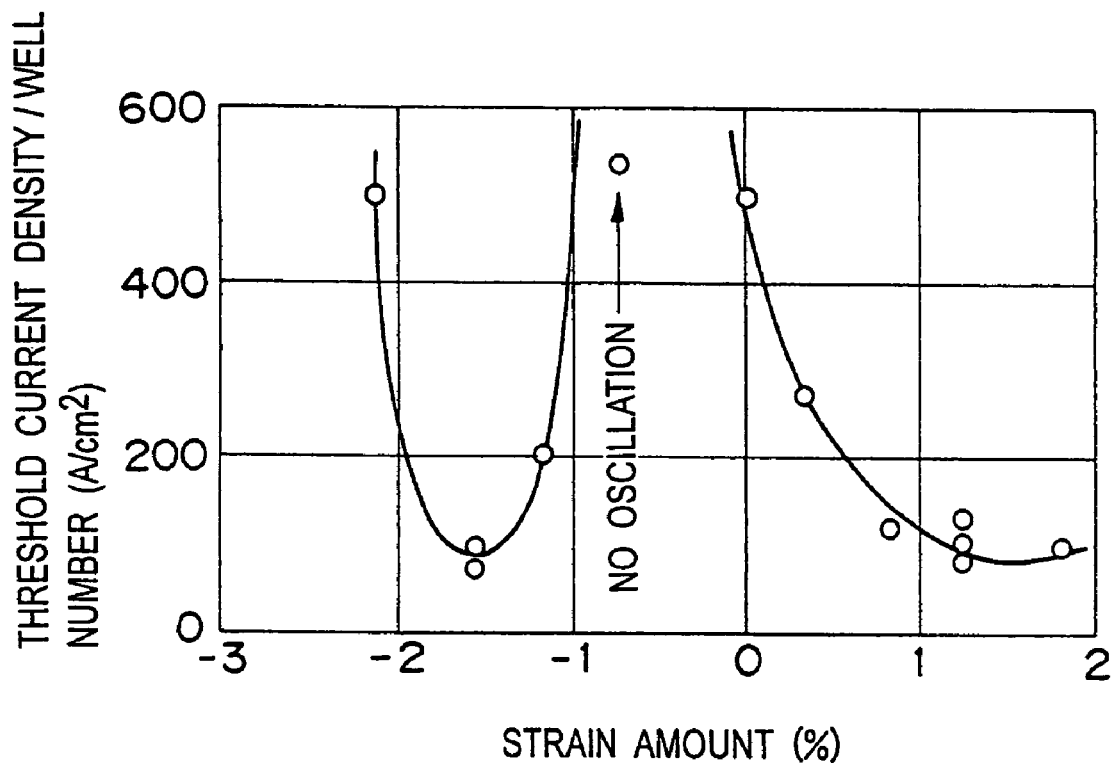
FIG. 11 is a drawing that shows a relationship between a strain amount and a threshold current density of an InGaAs well layer.

The "strain amount" hereinafter used in the following embodiments is defined as $\{a(X)-a(GaAs)\}/a(GaAs) \times 100$ (%), where the lattice constant of the GaAs substrate is denoted by a(GaAs) and the lattice constant of a material constructing a subject layer is denoted by a(X). With regard to the strain of the well layer or the barrier layer, when a value of the strain amount i.e. $\{a(X)-a(GaAs)\}/a(GaAs) \times 100(\%)$ is positive, the strain is referred to as a "compressive strain". When a value of the strain amount is negative, the strain is defined as a "tensile strain". The magnitude or amount of the compressive/tensile stain is expressed by an absolute value of the value of the above expression. As described above, FIG. 4 shows changes of the threshold current density by introduction of strain, which changes are specifically shown by the ratio of "the threshold current density in the case where strain is introduced to the well layer" to "the threshold current density in the case where the well layer has no strain". The results shown in FIG. 4 are different from the results of the threshold current density shown in FIG. 11 which are obtained by using the InGaAs well semiconductor laser device that oscillates at a long wavelength for communication. This is presumably attributed to a difference in material used for the well layer or in oscillation wavelength.

As mentioned above, in the present embodiment, spinodal decomposition does not occur when growing InGaAsP by using the MOCVD method or the like, which is achieved by preventing degradation of the active region with at least the well layers formed of aluminum-free InGaAsP, and by setting the P composition of the well layer to 0.51 smaller than 0.55 within the region (a) having a compressive strain of not more than 1% in FIG. 3. Further, the threshold current can be lowered by introducing an appropriate amount of compressive strain for reducing the threshold current, namely, a compressive strain 0.65% that is less than 1% and more than 0.25%. As a result, a 0.78-μm band optical disc use semiconductor laser device is obtained which enables a long time operation even at a high optical power of 100 mW or more.

Furthermore, in the present embodiment, a stress due to the compressive strain of the well layer is compensated by introducing a tensile strain of 1.2% to the barrier layers within the active region. Thereby, it becomes difficult that degradation of crystals due to the stress occurs in the well layers. Consequently, the semiconductor laser device is further improved in reliability during high power operation.

In the case of using a semiconductor laser device including a layer into which strain is introduced, crystal degradation is caused by its own stress if the thickness of the layer is too thick. Thickness of a layer causing the degradation of crystals is referred to as a critical layer thickness. There are several formulas for calculation of the critical layer thickness. In general, the calculation thereof is often conducted by Matthew's theory (Thin Solid Films, 26, 1, pp. 129–134 (1975)). In the case where layers having two or more different strain amounts are combined, such as the case where strain is introduced to the barrier layers like the present embodiment, it is required to consider not only the critical layer thickness of each layer within the active region but also the critical layer thickness with respect to the average strain amount $\Delta$ in the whole active region.

Specifically, it is required to make smaller the total thickness $\Sigma(Dwm+Dbn)$ within the active region than the critical layer thickness obtained from the average strain amount $\Delta$ within the active region, which is defined as $\Delta=\Sigma(\Delta Awm \times Dwm + \Delta Abn \times Dbn)/(\Sigma(Dwm+Dbn))$, where layer thicknesses of the well layers (the number of layers: m) and the barrier layers (the number of layers: n) are defined as Dwm, Dbn, respectively and the strain amounts thereof are defined as $\Delta Awm$, $\Delta Abn$, respectively. In the case of the present embodiment, while the theoretical value of the critical layer thickness of the quantum well active region (average strain amount: −0.45%) is 58 nm, the actual total layer thickness of the quantum well active region is 37 nm, which is thinner than the theoretical value of the critical layer thickness, thus satisfying the condition in which degradation of crystals does not occur. The strain amounts of respective layers i.e. $\Delta Awm$ and $\Delta Abn$, which are used in calculation of the average strain amount $\Delta$, are positive in the case of the compressive strain and negative in the case of the tensile strain as defined in the above.

In the present embodiment, a relatively large tensile strain of 1.2% is introduced to the barrier layers for the purpose of improvement in the threshold current. In the InGaAsP crystals used for barrier layers of a 0.78-μm band quantum well semiconductor laser device, Eg generally becomes larger as the tensile strain amount becomes larger. Therefore, difference between the bandgap energy Eg(w) of the well layer and the bandgap energy Eg(b) of the barrier layer, i.e., $\Delta Eg=(Eg(b)-Eg(w))$, is increased by introducing a large tensile strain to the barrier layers as in the case of the present embodiment. As a result, the increase of $\Delta Eg$ leads to reduction of the phenomena that carriers overflow from the well layer, so that the threshold current value of laser is lowered.

In the present embodiment, growth conditions such as growth pressures, flow rates of material gases and partial pressures are optimized under the growth temperature of 670° C. in the periphery of the multiquantum well active region 12. Thereby, crystals with suppression of spinodal decomposition and without degradation due to detachment of P are obtained, which leads to high-power, good characteristics and high reliability of device. In the same manner, optimized growth conditions are used at each of their growth temperatures when growing semiconductor laser devices in the following second to fourth embodiments.

Second Emodiment

Figure 5:
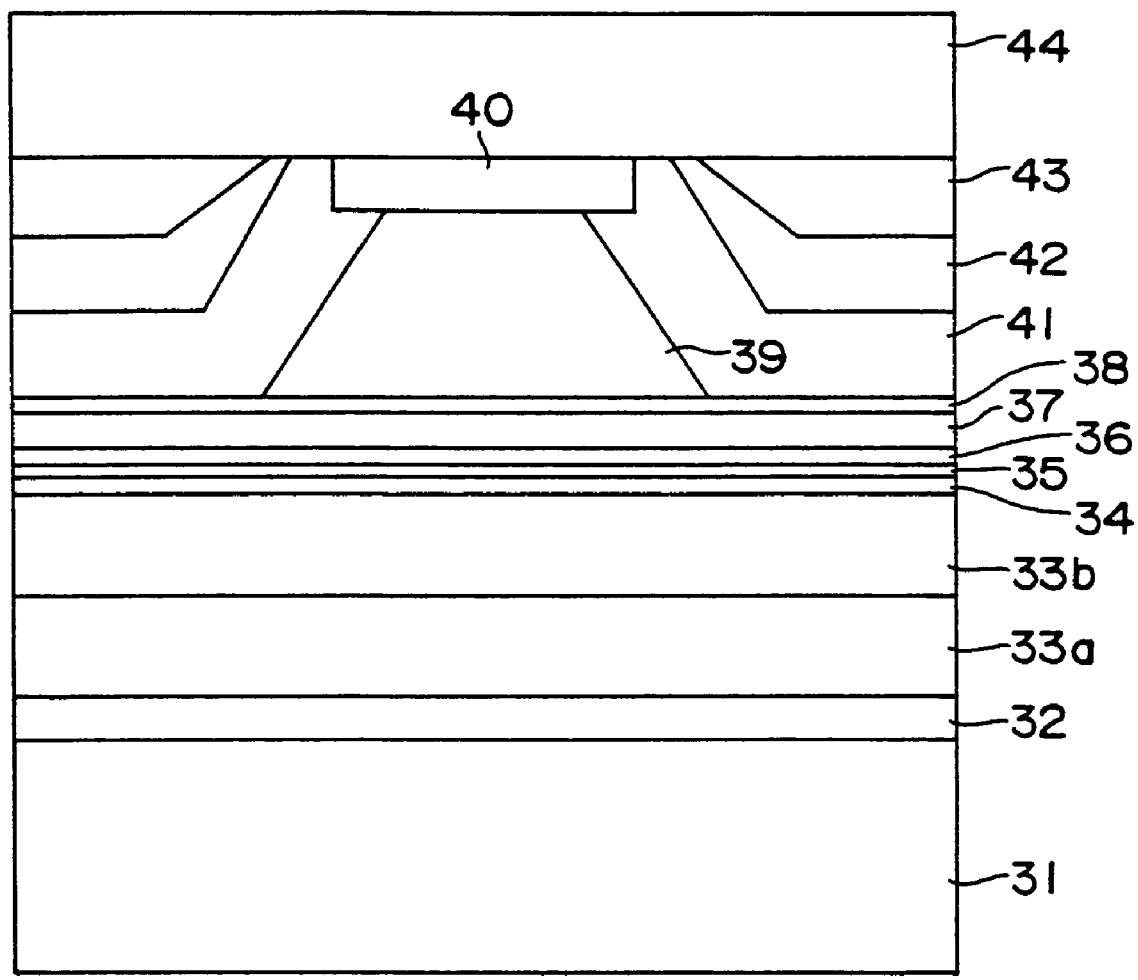
FIG. 5 is a cross sectional view showing a constitution in a semiconductor laser device different from FIG. 1.

FIG. 5 is a cross sectional view showing a constitution of a semiconductor laser device of the second embodiment. In the semiconductor laser device of the present embodiment, as shown in FIG. 5, on an n-type GaAs substrate 31, there are sequentially stacked an n-type GaAs buffer layer (layer thickness of 0.5 μm) 32, an n-type $Al_{0.4}Ga_{0.6}As$ lower first cladding layer (layer thickness of 1.5 μm) 33a, an n-type $Al_{0.5}Ga_{0.5}As$ lower second cladding layer (layer thickness of 1.5 μm) 33b, an i-type $Al_{0.35}Ga_{0.65}As$ lower light-guiding layer (layer thickness of 30 nm) 34, a multiquantum well active region (oscillation wavelength of 0.78 μm) 35, an i-type $Al_{0.35}Ga_{0.65}As$ upper light-guiding layer (layer thickness of 30 nm) 36, a p-type $Al_{0.5}Ga_{0.5}As$ upper first cladding layer (layer thickness of 0.2 μm) 37, a p-type GaAs etching stopper layer (layer thickness of 3 nm) 38, a p-type $Al_{0.5}Ga_{0.5}As$ upper second cladding layer (layer thickness of 1.2 μm) 39 and a p-type GaAs contact layer (layer thickness of 0.7 μm) 40. A ridge stripe structure is formed immediately above the p-type GaAs etching stopper layer 38. The ridge stripe structure is constructed of the AlGaAs upper second cladding layer 39 and the GaAs contact layer 40. The ridge stripe structure is about 2 μm in height and about 2 μm in width at the widest portion immediately above the etching stopper layer 38.

Further, an n-type $Al_{0.7}Ga_{0.3}As$ first buried layer (layer thickness of 0.6 μm) 41, an n-type GaAs second buried layer (layer thickness of 0.6 μm) 42 and a p-type GaAs third buried layer (layer thickness of 0.7 μm) 43 are sequentially formed on both sides of the ridge stripe structure in such a manner as to fill gaps on lateral sides of the ridge stripe structure. Thereby, a current constriction structure is formed so that a current flows only mainly immediately below the ridge stripe structure. Furthermore, a p-type GaAs cap layer (layer thickness of 2 μm) 44 is stacked on an entire surface over the ridge stripe structure and the first to third buried layers 41 to 43.

The multiquantum well active region 35 is formed by alternately stacking two $In_{0.27}Ga_{0.73}As_{0.55}P_{0.45}$ well layers having a compressive strain of 0.35% (each layer with a layer thickness of 8 nm) and three $In_{0.09}Ga_{0.91}As_{0.41}P_{0.59}$ barrier layers having a tensile strain of 1.45% (a first and a third layer has a layer thickness of 10 nm, and a second layer has a layer thickness of 5 nm). That is, each well layer is interposed between the barrier layers. When growing layers around the multiquantum well active region 35, the atmospheric temperature is set to 670° C.

In the semiconductor laser device of the present embodiment, peripheral layers of the well layers are made aluminum-free, and the P composition of the InGaAsP well layers is set to 0.45 smaller than 0.5 within the region (a) having a compressive strain of not more than 1%, as in the case of the semiconductor laser device of the first embodiment. Therefore, spinodal decomposition does not occur when forming a multiquantum well active region by the MOCVD method or the like. Further, the strain amount of the well layers is set to an appropriate value of 0.35% that is less than 1% and more than 0.25% so as to contrive a reduction in the threshold current. Furthermore, the strain compensation structure is also adopted. Therefore, stable high-power operation of the semiconductor laser device can be performed when it is operated at an oscillation wavelength of 0.78 μm.

In the present embodiment, the temperature at which spinodal decomposition occurs is further lower than that of the first embodiment because the compressive strain amount of the well layers is set to not more than 0.5%. Therefore, degradation of crystals in the well layers due to spinodal decomposition does not occur even if the growth temperature is set to a somewhat lower temperature in order to suppress detachment of P when growing the well layers and the barrier layers. Thus, high reliability can be secured which is equal to or higher than that of the first embodiment.

The average strain amount and total layer thickness of the active region are −0.75% and 41 nm respectively in the semiconductor laser device of the present embodiment. The semiconductor laser device of the present embodiment has good reliability although the total layer thickness of 41 nm is larger than the calculated critical layer thickness of 31 nm. It is presumed that the critical layer thickness in view of the characteristics of the semiconductor laser is actually larger than that of Matthew's theory, at least in the strain compensation structure made of the InGaAsP material on the GaAs substrate as in the case of the present embodiment. As the result of various studies, it has been revealed that sufficient characteristics for a semiconductor laser device is obtained when a layer thickness is smaller than 1.5 times the critical layer thickness introduced by Matthew's theory. The total layer thickness 41 nm of the active region in the semiconductor laser device of the present embodiment is smaller than 46.5 nm which is 1.5 times the critical layer thickness 31 nm. No degradation of crystals occurs and thus good reliability of the semiconductor laser device is exhibited.

Third Embodiment

Figure 6:
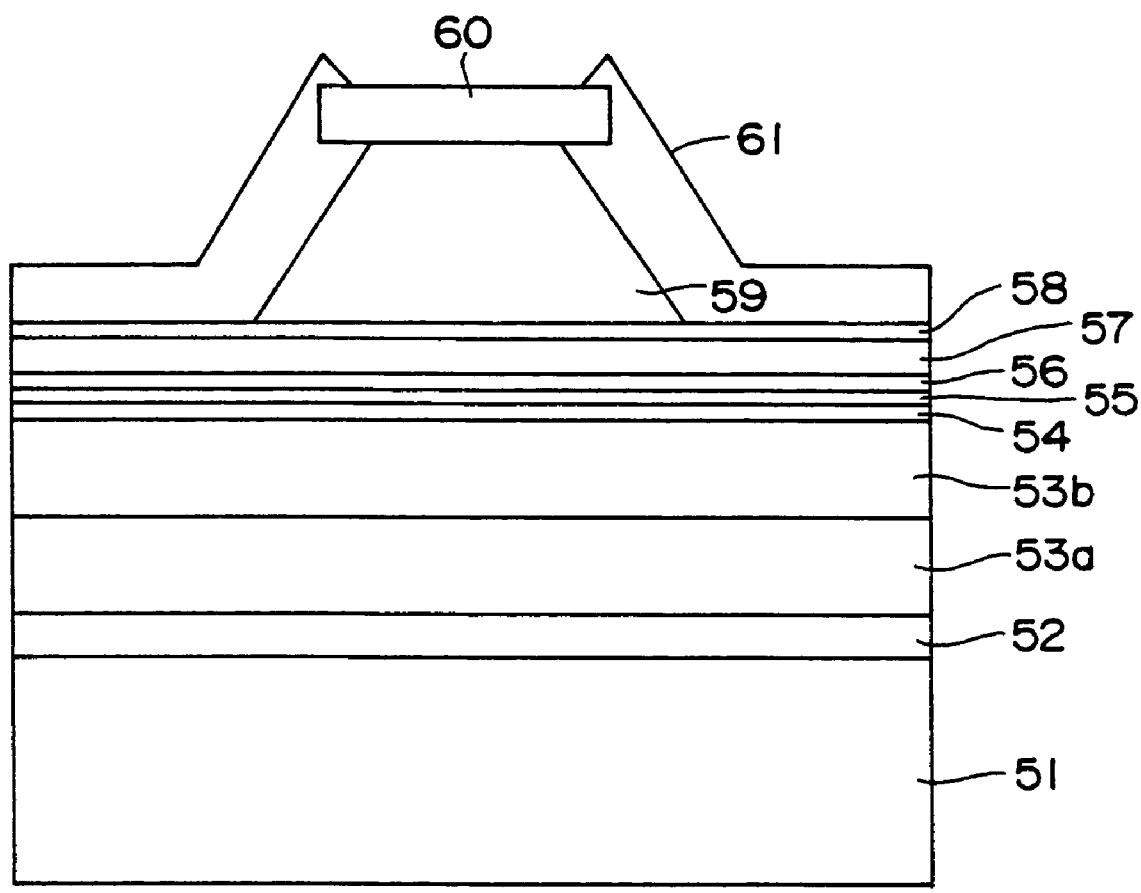
FIG. 6 is a cross sectional view showing a constitution in a semiconductor laser device different from FIG. 1 and FIG. 5.

FIG. 6 is a cross sectional view showing a constitution in a semiconductor laser device of the third embodiment. As shown in FIG. 6, in the semiconductor laser device of the present embodiment, on an n-type GaAs substrate 51, there are sequentially stacked an n-type GaAs buffer layer (layer thickness of 0.5 μm) 52, an n-type $Al_{0.4}Ga_{0.6}As$ lower first cladding layer (layer thickness of 1.3 μm) 53a, an n-type $Al_{0.5}Ga_{0.5}As$ lower second cladding layer (layer thickness of 1.0 μm) 53b, a lower light-guiding layer 54 consisting of two layers of an i-type $Al_{0.35}Ga_{0.65}As$ (layer thickness of 30 nm) and an i-type $Al_{0.25}Ga_{0.75}As$ (layer thickness of 3 nm) in this order, a multiquantum well active region (oscillation wavelength of 0.78 μm) 55, an upper light-guiding layer 56 consisting of two layers of an i-type $Al_{0.25}Ga_{0.75}As$ (layer thickness of 3 nm) and an i-type $Al_{0.35}Ga_{0.65}As$ (layer thickness of 30 nm) in this order, a p-type $Al_{0.5}Ga_{0.5}As$ upper first cladding layer (layer thickness of 0.2 μm) 57, a p-type GaAs etching stopper layer (layer thickness of 3 nm) 58, a p-type $Al_{0.5}Ga_{0.5}As$ upper second cladding layer (layer thickness of 1.2 μm) 59 and a p-type GaAs contact layer (layer thickness of 1.0 μm) 60. A ridge stripe structure formed of the AlGaAs upper second cladding layer 59 and the GaAs contact layer 60 is formed immediately above the GaAs etching stopper layer 58. The ridge stripe structure is about 2.2 μm in height and about 2.5 μm in width at the widest portion immediately above the etching stopper layer 58.

Further, a SiN film for an insulating film 61 is formed on lateral sides of the ridge stripe structure and on the etching stopper layer 58 outside thereof, so that a current constriction structure is formed in which a current mainly flows only immediately below the ridge stripe structure.

The multiquantum well active region 55 is formed by alternately stacking two $In_{0.25}Ga_{0.75}As_{0.57}P_{0.43}$ well layers having a compressive strain of 0.28% (each layer having a thickness of 11 nm) and three $GaAs_{0.66}P_{0.34}$ barrier layers having a tensile strain of 1.2% (a first and a third layer with a thickness of 7 nm and a second layer having a thickness of 6 nm). That is, each well layer is interposed between the barrier layers. The growth temperature during making the semiconductor laser device of the present embodiment is set to 650° C.

In the semiconductor laser device of the present embodiment, peripheral layers of the well layers are made aluminum-free, and the P composition of the InGaAsP well layers is set to 0.43 smaller than 0.50 within the region (a) having a compressive strain of not more than 1% as in the cases of the semiconductor laser devices of the first and second embodiments. Therefore, spinodal decomposition does not occur when forming a multiquantum well active region by the MOCVD method or the like. Further, the strain amount of the well layers is set to an appropriate value of 0.28% that is less than 1% and more than 0.25% so as to contrive a reduction in the threshold current. Furthermore, the strain compensation structure is also adopted. Therefore, stable high-power operation of the semiconductor laser device can be performed when it is operated at an oscillation wavelength of 0.78 μm.

In the present embodiment, the strain of the well layers is set to a compressive strain with a small strain amount, and the thickness of each well layer is set to a relatively large thickness of 11 nm. Thus, even if there is a big difference in absolute value between the strain amount of the well layers having a compressive strain and the strain amount of the barrier layers having a tensile strain, the average strain amount within the active region becomes smaller, so that the theoretical value of the critical layer thickness in the active region is larger than the actual layer thickness in the active region.

The average strain amounts of the well layers, the barrier layers and the active region are +0.28%, −1.2% and −0.42% respectively in the semiconductor laser device of the present embodiment. The critical layer thickness of the active region and the actual total layer thickness of the active region are 63 nm and 42 nm, respectively. In this way, the compressive strain amount of the well layers is set to 0.28% that is a value close to the lower limit (0.25%) of the strain amount and effective for the reduction of the threshold current. The reason therefor is to suppress degradation of crystals as much as possible in the active region due to spinodal decomposition. Further, in the semiconductor laser device of the present embodiment, it is possible to make the theoretical value of the critical layer thickness of 63 nm, which is about 1.5 times the actual total layer thickness of the active region of 42 nm. This is achieved by setting the thickness of the well layers to at least 1.5 times the thickness of the barrier layers.

As described above, in the semiconductor laser device of the present embodiment, the thickness of the well layers is increased under the conditions that the well layers have a low compressive strain and that the barrier layers have a high tensile strain, while satisfying the conditions that the P composition in the InGaAsP well layers is less than 0.50, and that the strain amount of the well layers is less than 1% and more than 0.25%. Thereby, it is possible to obtain high reliability attributable to suppression of the degradation of crystals in the active region, and at the same time the low threshold current which has the same level as in the cases of the first and second embodiments. Furthermore, even if dullness occurs in a boundary portion of the band structure due to deterioration of steepness at an interface between the well layer and the barrier layer, thickness increase of the well layers makes relatively smaller effect of the dullness in the whole band structure within the active region. Therefore, this prevents deterioration of the characteristics derived from deterioration of the steepness at the interface between layers. The well layers preferably have a thickness of more than 8 nm in order to achieve the effect described here.

Fourth Embodiment

Figure 7:
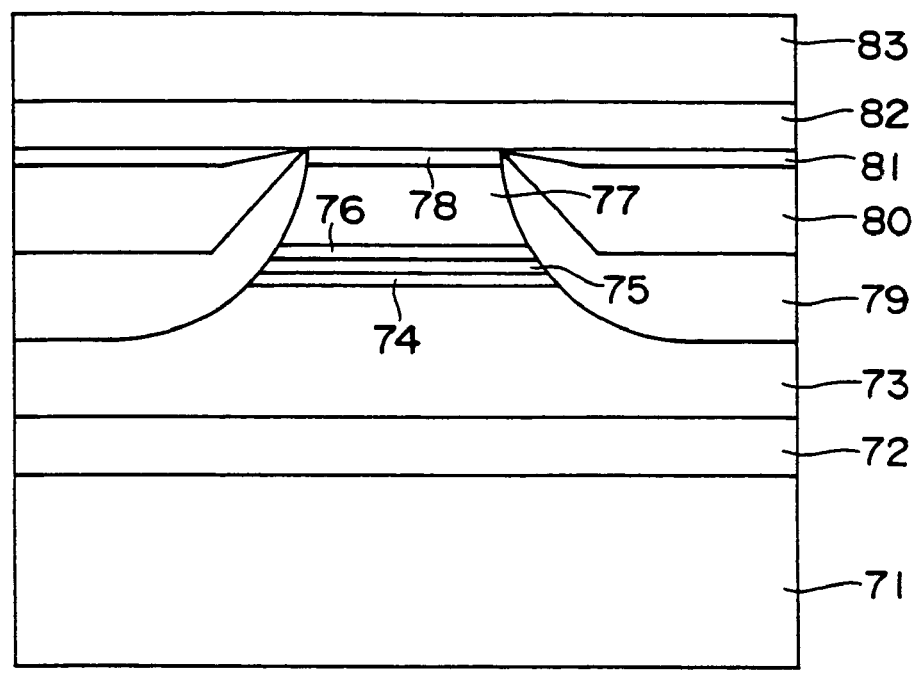
FIG. 7 is a cross sectional view showing a constitution in a semiconductor laser device different from FIG. 1, FIG. 5 and FIG. 6.

FIG. 7 is a cross sectional view showing a constitution in a semiconductor laser device of the fourth embodiment. As shown in FIG. 7, in the semiconductor laser device of the present embodiment, on an n-type GaAs substrate 71, there are stacked an n-type GaAs buffer layer (layer thickness of 0.5 µm) 72, an n-type $Al_{0.5}Ga_{0.5}As$ lower cladding layer (layer thickness of 1.7 µm) 73, an i-type $In_{0.49}Ga_{0.51}P$ lower light-guiding layer (layer thickness of 40 nm) 74, a multi-quantum well active region (oscillation wavelength of 0.775 µm) 75, an i-type $In_{0.49}Ga_{0.51}P$ upper light-guiding layer (layer thickness of 40 nm) 76, a p-type $Al_{0.5}Ga_{0.5}As$ upper first cladding layer (layer thickness of 1.44 µm) 77, and a p-type GaAs protective layer (layer thickness of 3 nm) 78 so as to form a mesa-stripe structure. The mesa-stripe structure has about 3 µm height and about 2 µm width at the widest portion. The lowermost portion thereof reaches half thickness of the n-type $Al_{0.5}Ga_{0.5}As$ lower cladding layer 73.

Further, a p-type $Al_{0.5}Ga_{0.5}As$ first buried layer (layer thickness of 1.5 µm) 79, an n-type $Al_{0.5}Ga_{0.5}As$ second buried layer (layer thickness of 1.5 µm) 80 and a p-type GaAs third buried layer (layer thickness of 0.1 µm) 81 are sequentially staked on both sides of the mesa-stripe structure in such a manner as to fill gaps on lateral sides thereof. Thus, a current constriction structure (so-called buried hetero-type structure) is formed where a current mainly passes through only the mesa-stripe structure. Further, a p-type $Al_{0.5}Ga_{0.5}As$ upper second cladding layer (layer thickness of 1.0 µm) 82 and a p-type GaAs cap layer (layer thickness of 2 µm) 83 are stacked on an entire surface over the mesa-stripe structure and the first to third buried layers 79 to 81.

The multiquantum well active region 75 is formed by alternately stacking two $In_{0.28}Ga_{0.72}As_{0.56}P_{0.44}$ well layers having a compressive strain of 0.46% (each layer having a thickness of 3.5 nm) and three $In_{0.35}Ga_{0.65}P$ barrier layers having a tensile strain of 1% (a first and a third layer having a thickness of 6 nm, and a second layer having a thickness of 5 nm). That is, each well layer is interposed between the barrier layers. The average strain amount of the multiquantum well active region 75 is −0.57%. The total layer thickness of the multiquantum well active region 75 is 24 nm, and the theoretical value of the critical layer thickness is not more than 44 nm.

In the semiconductor laser device of the present embodiment, peripheral layers of the well layers are made aluminum-free, and the P composition of the InGaAsP well layers is set to 0.44 smaller than 0.50 within the region (a) having a compressive strain of not more than 1% as in the cases of the semiconductor laser devices in the first to third embodiments. Therefore, spinodal decomposition does not occur when forming a multiquantum well active region by the MOCVD method or the like. Further, the strain amount of the well layers is set to an appropriate value of 0.46% that is less than 1% and more than 0.25% so as to contrive a reduction in the threshold current. Furthermore, the strain compensation structure is also adopted. Thus, a buried hetero quantum well semiconductor laser device is provided which can shows a stable high power during operation at an oscillation wavelength of 0.78 µm.

As described above, the first to fourth embodiments provide four types of semiconductor laser devices in this invention. The object of the invention is to obtain a semiconductor laser device having the oscillation wavelength of 0.78-µm band and stably operating even at such a high power of light as 100 mW or more. This is achieved by making the well layers out of InGaAsP to be aluminum-free, and by making the P composition of the well layers smaller than 0.55 within the region (a) having a compressive strain of not more than 1% so as to avoid occurrence of spinodal decomposition. Further, the strain amount thereof is optimally set to less than 1% and more than 0.25% to contrive the reduction of the threshold current. Furthermore, in some cases, a strain is introduced also to the barrier layers, where the strain has the same amount as that of the well layers but the opposite direction thereof. It should be noted that material composition, layer thickness, number of layers, strain amount and constitution of each of the other layers are not limited to those in the above-stated embodiments as long as they comply with the limitations set forth in claims.

Fifth Embodiment

Figure 8:
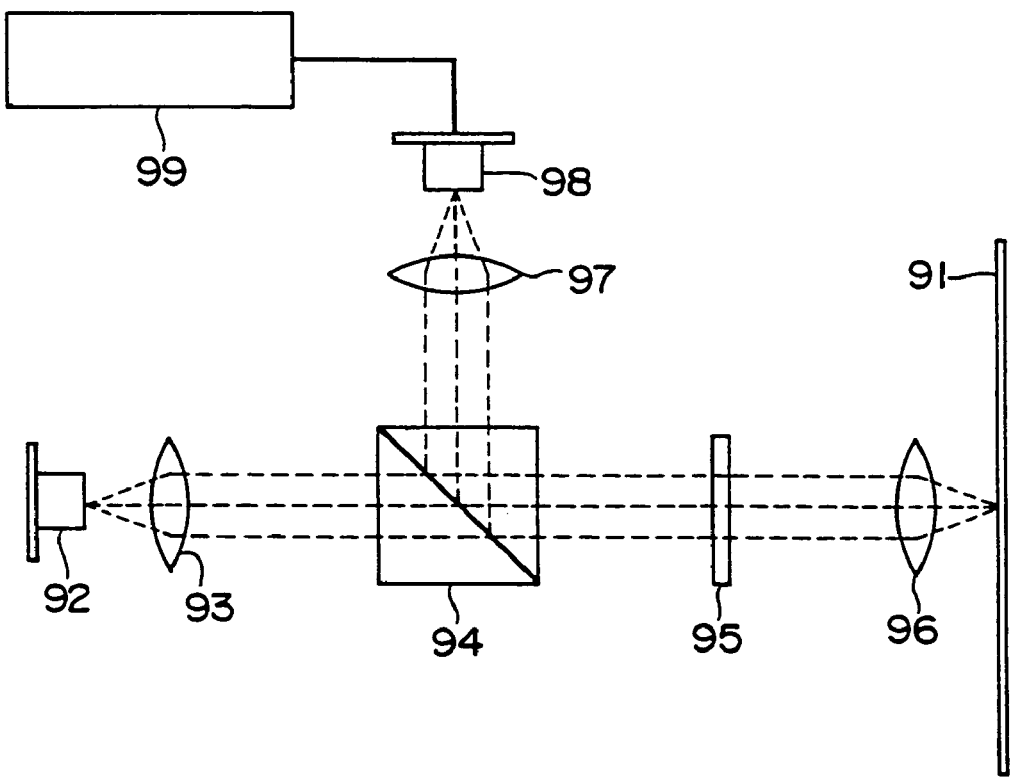
FIG. 8 is a constituent diagram of an optical disc unit of the present invention.
Figure 9:
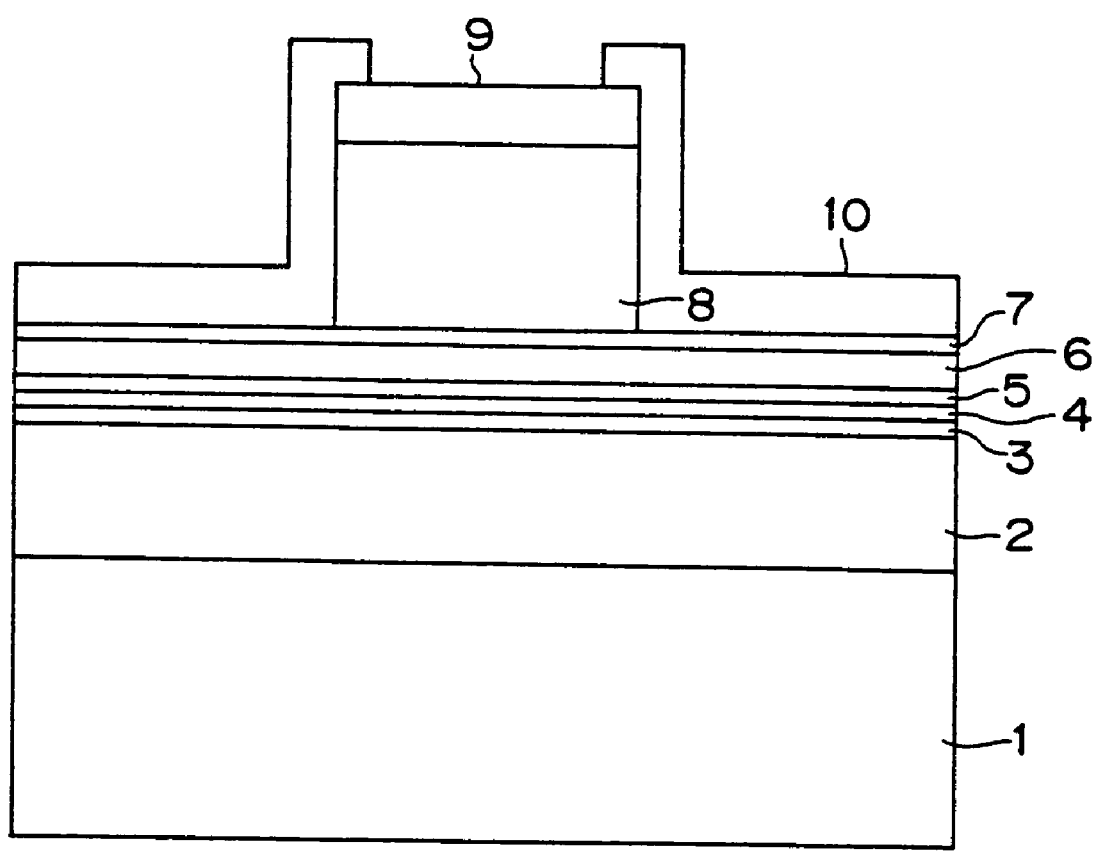
FIG. 9 is a cross sectional view showing a conventional aluminum-free structure of a semiconductor laser device.

The present embodiment relates to a recording/reproducing type optical disk unit using the semiconductor laser device in any one of the embodiments. FIG. 8 is a constituent diagram of the optical disc unit in the present embodiment. This optical disk unit operates to write data on an optical disk 91 or reproduce data written on the optical disk 91. The unit is provided with a semiconductor laser device 92 of any one of the above embodiments as a light-emitting device used for the above operation.

Constitution and operation of the optical disc unit will hereinafter be described. During write operations in this optical disk unit, signal light (i.e. a laser beam on which a data signal is superimposed) emitted from the semiconductor laser device 92 passes through a collimator lens 93 to become parallel light, and penetrates a beam splitter 94. Then, a λ/4 polarizer 95 adjusts a polarized state of the signal light and thereafter an irradiation objective lens 96 converges the signal light to irradiate the optical disk 91. In this manner, data are written on the optical disc 91 by the laser light on which the data signal is superimposed.

On the other hand, during read operations, a laser beam with no data signal superimposed thereon is emitted from the semiconductor laser device 92 and travels along the same path as in the write operation to irradiate the optical disk 91. Then, the laser beam is reflected by the surface of the optical disk 91 on which data has been recorded, and passes through the laser-beam irradiation objective lens 96 and the λ/4 polarizer 95. Thereafter, the beam splitter 94 reflects the laser beam so as for its traveling direction to be changed by 90°. Subsequently, the laser beam is focused by a light objective lens 97 to be incident on a signal-detection light-sensitive device 98. Then, by the signal-detection light-sensitive device 98, a data signal from the optical disk 91 is transformed into an electric signal according to the intensity of the incident laser beam. The data signal is reproduced to the original information signal by a signal-light reproduction circuit 99.

The optical disk unit of the present embodiment employs the semiconductor laser device 92 which operates with higher optical power than conventional ones, as described above. Therefore, even if the rotation number of the optical disk 91 is increased for a higher speed operation than ever before, the optical disk unit can read and write data. Thus, this optical disk unit reduces the access time to optical disks which access time has been a subject to be solved in write operations to CD-Rs, CD-RWs etc. As the result, the present invention makes it possible to provide an optical disk unit which allows more comfortable operations.

In this embodiment, there has been described the recording/reproducing type optical disk unit as an example of application of the semiconductor laser device according to any one of the other embodiments. However, this invention is not limited to this unit and may be also applied to optical-disk recorders or optical-disk reproducers where a semiconductor laser device of the 0.78 μm wavelength band is used as a light-emitting device.

The invention claimed is:

1. A semiconductor laser device having an oscillation wavelength of more than 0.76 μm and less than 0.8 μm, the semiconductor laser device comprising:
    a first conductive-type cladding layer;
    a first guide layer;
    a strained quantum well active region including a well layer to which a compressive strain is introduced;
    a second guide layer; and
    a second conductive-type cladding layer, at least which are sequentially stacked on a GaAs substrate, wherein the well layer is formed of $InGaAs_{1-x}P_x$, and wherein x<0.55, and $$\{a(\text{well})-a(\text{GaAs})\}/a(\text{GaAs})\times 100 < 0.8\%$$

where a(well) is defined as a lattice constant of a constituent material of the well layer, and
where a(GaAs) is defined as a lattice constant of the GaAs substrates, and the laser device has an oscillation wavelength of more than 0.76 μm and less than 0.8 μm.

2. The semiconductor laser device according to claim 1, wherein a value of [{a(well)−a(GaAs)}/a(GaAs)]×100 representing a strain amount of the well layer is more than 0.25%.

3. The semiconductor laser device according to claim 1, wherein a value of x that represents a P composition in Group V elements of the well layer is smaller than 0.50.

4. The semiconductor laser device according to claim 1, wherein the well layer has a strain amount of less than 0.5%.

5. The semiconductor laser device according to claim 1, wherein the strained quantum well active region includes a barrier layer into which a tensile strain is introduced.

6. The semiconductor laser device according to claim 1, wherein the well layer has a layer thickness larger than 8 nm.

7. An optical disc unit wherein the semiconductor laser device according to claim 1 is used as a light-emitting device.

* * * * *